United States Patent
Kons

(10) Patent No.: US 7,685,497 B2
(45) Date of Patent: Mar. 23, 2010

(54) METHOD AND APPARATUS FOR EFFICIENT COMPUTATION OF CHECK EQUATIONS IN PERIODICAL LOW DENSITY PARITY CHECK (LDPC) CODES

(75) Inventor: Shachar Kons, Haifa (IL)

(73) Assignee: NXP B.V., Eindhoven (NL)

( * ) Notice: Subject to any disclaimer, the term of this patent is extended or adjusted under 35 U.S.C. 154(b) by 1540 days.

(21) Appl. No.: 10/867,355

(22) Filed: Jun. 14, 2004

(65) Prior Publication Data

US 2005/0223305 A1     Oct. 6, 2005

Related U.S. Application Data

(60) Provisional application No. 60/558,539, filed on Mar. 31, 2004.

(51) Int. Cl.
*H03M 13/00* (2006.01)

(52) U.S. Cl. ............... 714/759; 714/752; 714/755; 714/737; 707/100

(58) Field of Classification Search ............ 714/752, 714/759, 755, 737; 707/100
See application file for complete search history.

(56) References Cited

U.S. PATENT DOCUMENTS

| | | | | |
|---|---|---|---|---|
| 6,731,686 B1* | 5/2004 | Sudharsanan et al. | .. | 375/240.25 |
| 6,957,375 B2* | 10/2005 | Richardson | ................ | 714/752 |
| 2004/0034828 A1* | 2/2004 | Hocevar | .................... | 714/800 |
| 2004/0153938 A1* | 8/2004 | Okamura et al. | ............ | 714/746 |
| 2005/0246611 A1* | 11/2005 | Jin et al. | .................... | 714/754 |

OTHER PUBLICATIONS

Mohammad M. Mansour and Naresh R. Shanbhag, Low-Power VLSI Decoder Architectures for LDPC Codes, 2002, ACM, pp. 286.*
Gallager, Robert G., "Low-Density Parity-Check Codes," pp. 1-90 (Jul. 1963).
Digital Video Broadcasting (DVB) Second Generation Framing Structure, Channel Coding and Modulation Systems for Broadcasting, Interactive Services, News Gathering and Other Broadband Satellite Applications, ETSI EN 302 307 V1.1.1, pp. 1-73 (Jan. 2004).

\* cited by examiner

*Primary Examiner*—M. Mujtaba K Chaudry
*Assistant Examiner*—Enam Ahmed

(57) ABSTRACT

A periodic Low Density Parity Check (LPDC) coding apparatus and method allows reference to an LDPC code parity check matrix, where such reference is accomplished row by row. A specially configured memory and cyclical shift operation are used by the apparatus to efficiently compute check equations of the periodic LDPC code.

6 Claims, 4 Drawing Sheets

METHOD AND APPARATUS FOR EFFICIENT COMPUTATION OF CHECK EQUATIONS IN PERIODICAL LOW DENSITY PARITY CHECK (LDPC) CODES

This application claims priority to U.S. Provisional Application No. 60/558,539, filed on Mar. 31, 2004, which is hereby incorporated by reference.

BACKGROUND

1. Field of the Invention

This invention relates to the field of data coding and more particularly to an apparatus and method for efficient computation of check equations in periodic Low Density Parity Check (LDPC) codes.

2. Related Art

Low Density Parity Check (LDPC) codes are a group of linear block codes, which are characterized by a sparse Parity Check matrix. Early LDPC codes have been described in "Low Density Parity-Check Codes," by R. G. Gallager, available through MIT Press, Cambridge, Mass., 1963. which is incorporated herein by reference. Among other applications, LDPC codes are used in Digital Video Broadcasting (DVB), and are applicable to the DVB-S2 standard for DVB. The field is in need of more efficient implementation of LDPC coders and decoders.

SUMMARY OF THE INVENTION

An apparatus and method for efficient computation of check equations in periodic Low Density Parity Check (LDPC) codes is provided. The inventive LDPC coding apparatus allows reference to an LDPC code parity check matrix, where reference to the LDPC code parity check matrix is accomplished row by row, instead of column by column, as is done in known LDPC coding methods. In accordance with an exemplary embodiment of the invention, this unique approach to LDPC coding can be efficiently implemented using a novel memory configuration and cyclical shift operations.

Related systems, methods, features and advantages of the invention or combinations of the foregoing will be or will become apparent to one with skill in the art upon examination of the following figures and detailed description. It is intended that all such additional systems, methods, features, advantages and combinations be included within this description, be within the scope of the invention, and be protected by the accompanying claims.

DESCRIPTION OF THE FIGURES

The invention can be better understood with reference to the following figures. The components in the figures are not necessarily to scale, emphasis instead being placed upon a clearly illustrating the principles of the present invention. Moreover, in the drawings, like reference numerals designate corresponding parts throughout the several views.

In FIG. 3, the '0's are not illustrated for simplicity in demonstrating the concepts.

DETAILED DESCRIPTION

I. Introduction to Periodical LDPC Codes

Figure 1:
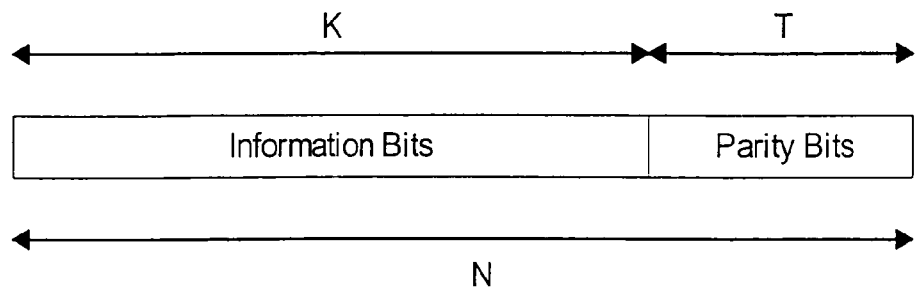
FIG. 1 shows a binary systematic LDPC codeword.

Low Density Parity Check (LDPC) codes are a group of linear block codes, which are characterized by a sparse Parity Check matrix. In its binary systematic form, as shown in FIG. 1, a rate K/N LDPC codeword is constructed from K information bits and T parity bits, where N=K+T.

More formally, a binary LDPC codeword C is derived by multiplying an information bit vector U by a binary Generator matrix G, where all the additions are modulo-2

$$U_{1 \times K} \cdot G_{K \times N} = C_{1 \times N}$$

The Parity Check matrix H is the one solving the equation $$G_{K \times N} \cdot (H_{T \times N})^T = 0_{K \times T}$$

Figure 2:
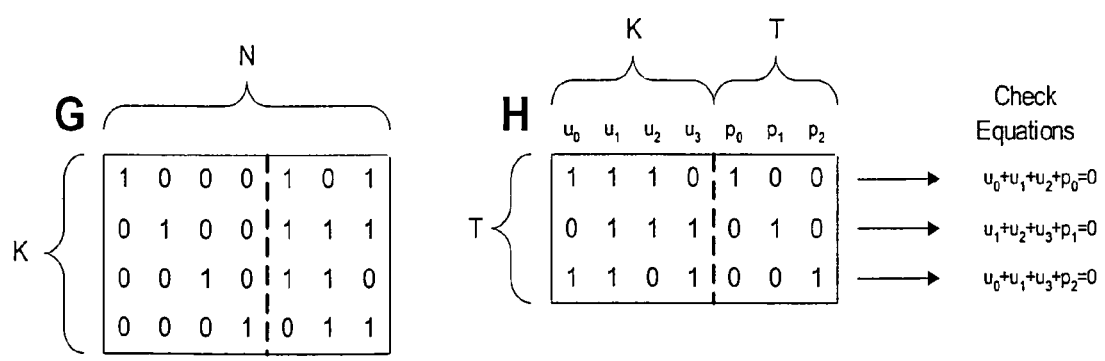
FIG. 2 shows examples of a generator matrix, a parity check matrix, and check equations.

The T rows of the Parity Check matrix H define T check equations. For a bit vector $R_{1 \times N}$, a check equation is the Modulo-2 summation of the vector's bits identified by the positions of '1's in a row of H. When R is a valid codeword, all the check equations are satisfied (equal to zero). An example of a Generator matrix, a Parity Check matrix and its check equations is shown in FIG. 2, for a Hamming code with K=4 and T=3.

Periodic LDPC codes are discussed in "Digital Video Broadcasting (DVB), Second generation framing structure, channel coding and modulation systems for Broadcasting, Interactive Services, News Gathering and other broadband satellite applications", ETSI EN 302 307 v1.1.1 (2004-01) ("The ETSI article"), which is incorporated herein by reference. Periodical LDPC codes may be derived in three steps. First, all the parity bits $p_j$ (j=0, 1, 2, ..., T−1) are initialized to zero. Then, the code defines for every information bit $u_i$ (i=0, 1, 2, ..., K−1), in which check equations it participates. This is equivalent to defining the locations of '1's in column i of the Parity Check matrix H. For example, if bit $u_i$ participates in check equation j ($H_{j,i}=1$), then parity bit $p_j$ is updated with $(p_j+u_i)$mod2. Finally, all the parity bits are chained by updating parity bits $p_j$ with $(p_j+p_{j-1})$mod2 for all j=1, 2, ..., T−1.

The periodicity of the code is introduced in the second step, where the locations of '1's in the Parity Check matrix are defined in a constant table only for the first column of every group of M columns. The other columns of the group are shifted versions of the first column by a linearly growing factor q=T/M. Thus, bit $u_i$ participates in check equations $j_d$ according to the following formula $$j_d = (\text{Table}_{r,d} + c \cdot q) \bmod T$$

where c=i modM is the index within the group, r=⌊i/M⌋ is the table row index and d=0, 1, 2, ..., deg(Table$_r$)−1 is an index to one of the elements within the table row.

Figure 3:
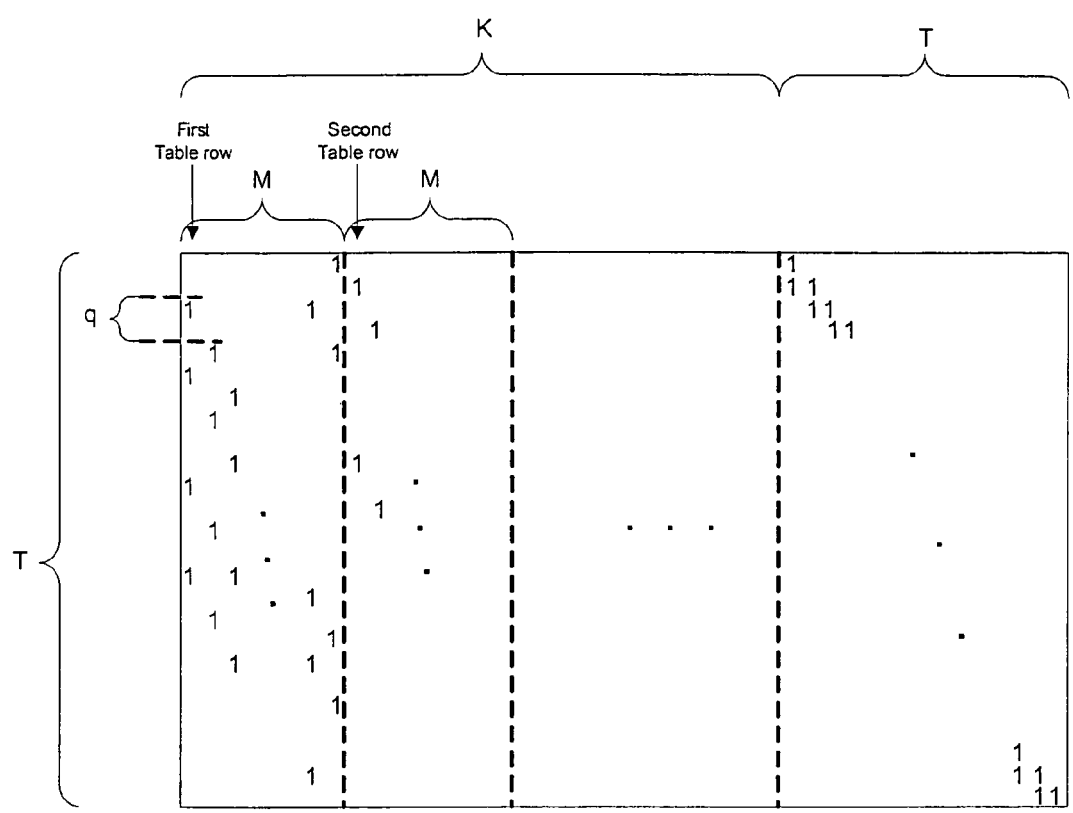
FIG. 3 shows a periodic LDPC code example.

For a complete definition of a Periodic LDPC code, a table with K/M rows is required, where each row represents the first column of a group of M columns. The number of elements (check equation indexes) in the row may vary from row to row. An example for such a code is illustrated in FIG. 3. For the codes described in the ETSI article, the parameters N=64800 and M=360 are fixed. The other parameters K and T are code rate dependent, but are always multiples of M=360.

II. Efficient Computation of Check Equations

The code description of the Periodic LDPC codes given in the ETSI article, which is equivalent to defining the matrix H columns, does not allow efficient hardware implementation of encoding and decoding especially for long codewords (N is large). For example, encoding an information vector would require the following steps:

1. Resetting to zero storage elements representing the parity bits. For low rate codes, where T is large, storing these bits in Flip-Flops is inefficient and a memory of T×1 bits is required. A sequence of T write operations should be applied to clear the memory contents. Making this memory wider will simplify this operation but will complicate significantly the parity updating step described next.

2. For every one of the K information bits, the indexes of the check equations for each bit are derived according to the table and formula. Then, the proper parity bits should be read from the memory, added modulo-2 to the information bit and stored back. This large amount of operations can be reduced by processing several information bits at a time. However, this would require multiple-addresses access to the parity bit memory, which is not available with standard memories.

The following sections describe an efficient way for computing the check equations by defining the Parity Check matrix H by its rows and not its columns. This also allows simple parallel processing of up to M check equations at a time.

A. Inverse Tables Derivation

A Periodic LDPC code's Table describes for every column of the Parity Check matrix, where the '1's are located. An inverse table describes for every row of the Parity Check matrix, where the '1's are located.

In order to derive the inverse table, it is required to find for each check equation index j, which bit indexes i satisfy the equation $$j = (\text{Table}_{\lfloor i/M \rfloor, d} + (i \bmod M) \cdot q) \bmod T.$$

As described in the previous section, the Parity Check matrix is constructed in such a way that every group of M columns are generated from one row of the table (Table$_r$), which is then modulo-T shifted every column by the factor q.

The equation $j = (\text{Table}_{r,d} + s \cdot q) \bmod T$ is extracted for s $$s = \begin{cases} \dfrac{j - \text{Table}_{r,d}}{q} & j - \text{Table}_{r,d} \geq 0 \\ \dfrac{j - \text{Table}_{r,d} + T}{q} & \text{else} \end{cases}$$

where a solution is found only if s is an integer. The solutions for the equation, $s_n$, are derived after a linear search over all the elements of the Table ($\forall r, d$). Thus, the indexes of the bits participating in check equation j are $i_n = M \cdot r_n + s_n$, where $r_n$ is the row index of the Table for which $s_n$ was found.

The procedure is simplified further after deriving the complete set of $\{r_n, s_n\}$ for all the check equations. It can be easily seen that $r_n$ repeats itself every set of q check equations and that $s_n$ is increased by one (modulo-M) every set of q check equations. Therefore, it is sufficient to store two constant inverse tables, TableR and TableS for the $r_n$ and $s_n$ values of only the first q check equations. From these inverse tables the indexes of bits participating in check equation j are easily derived as $$i_n = M \cdot \text{TableR}_{\lfloor j/q \rfloor, n} + \{(\text{TableS}_{\lfloor j/q \rfloor, n} + (j \bmod q)) \bmod M\}.$$

Every row in the inverse tables represents a set of M check equations separated by q indexes.

For the codes described in the ETSI article, the number of information bits participating in each check equation, $d_U$, is constant. Therefore, the size of each inverse table is $q \times d_U$. These tables can be stored in a Read-Only-Memory (ROM) and be read out value by value sequentially.

B. Storage Device Configuration

Figure 4:
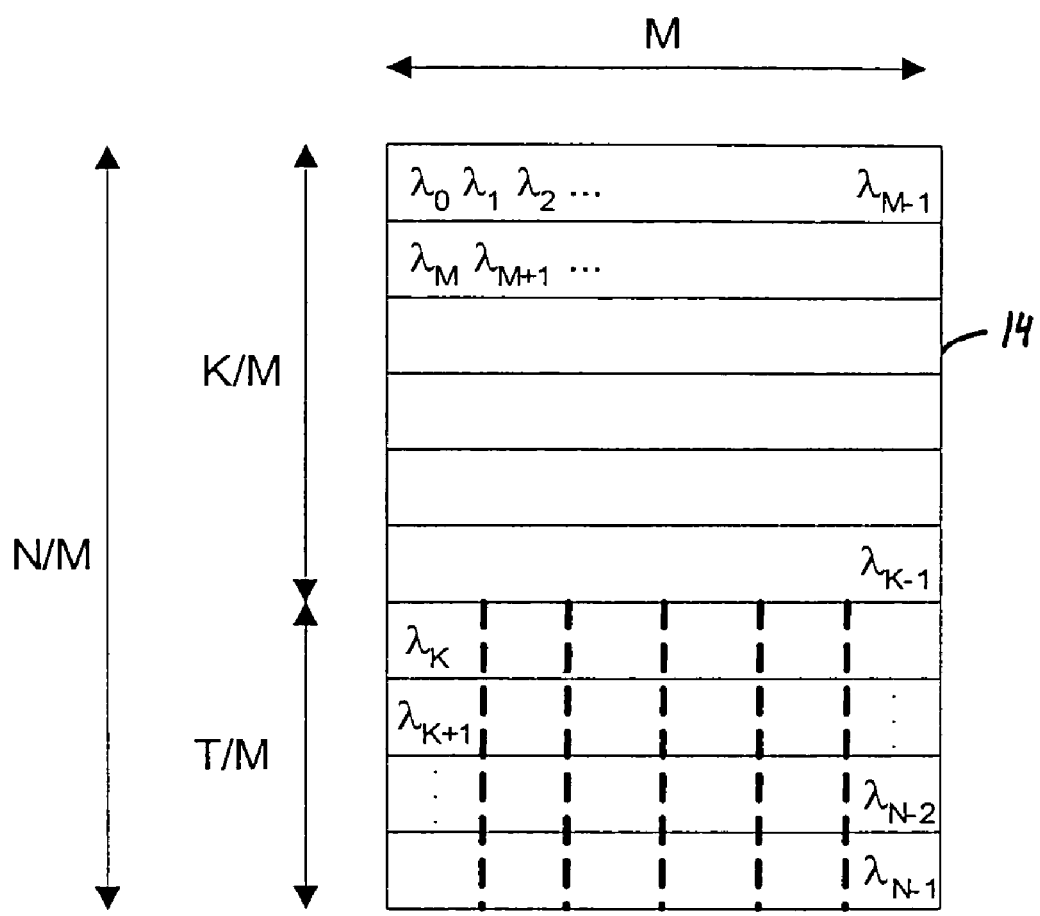
FIG. 4 shows a storage device configuration for LDPC coding.
Figure 5:
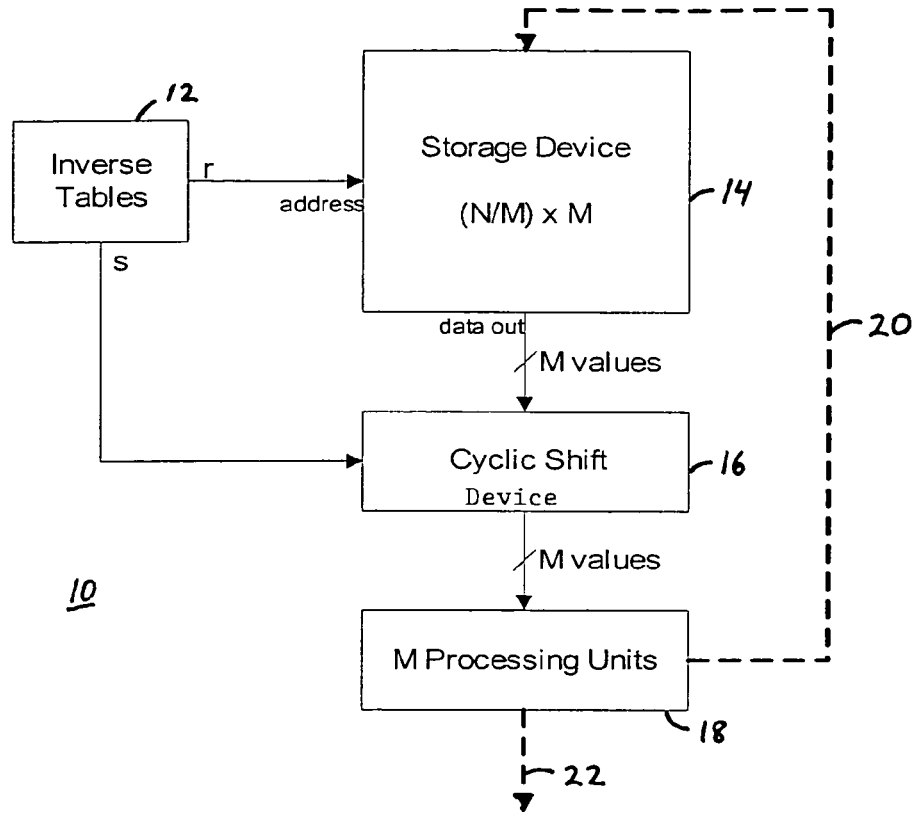
FIG. 5 shows a conceptual block diagram of an apparatus for computation of LDPC check equations, in accordance with an exemplary embodiment of the present invention.

As shown in FIGS. 4-5, a random access storage device (such as a RAM) is required for both encoding and decoding of LDPC codes. In the encoding process, the K information bits are stored in a storage device 14 and then processed to produce additional T parity bits. In the decoding process, a received vector of N values is stored in the storage device 14 and then processed in the LDPC iterative decoder to estimate the information bits.

In order to allow parallel processing of up to M check equations in both encoding and decoding, a special configuration is required for the storage device 14. The storage memory 14 is arranged in rows of M values $\lambda_i$. These values can be bits (encoding or hard decision decoding) or probability measures (likelihoods, including logarithmic likelihoods) of the received bits (decoding). In the first K/M rows, the values are stored sequentially row by row. In the following T/M rows, the values are stored column by column, as illustrated in FIG. 4.

C. Conceptual Block Diagram

A conceptual block diagram of an exemplary apparatus 10 for efficient computation of the check equations is shown in FIG. 5. The apparatus 10 can be used for both encoding and decoding, as discussed in further detail below. FIG. 5 includes a first memory element 12 for storing inverse tables and a second memory element 14 referred to as a storage device. The inverse tables TableR and TableS, stored in the first memory element 12, are read sequentially for the r and s values respectively. The first memory element 12 can be any suitable type of memory, including a ROM. The row of stored values indexed by r is read from the storage device 14, for its M values $\lambda_i$. These values are then cyclically shifted by s using a cyclical shift device 16. The cyclical shift device can be any suitable device for shifting binary values, such as a programmable barrel shifter. The cyclic shift operation is defined by the operation $\text{Out}[i] = \text{In}[(i+s) \bmod M]$ for $i = 0, 1, 2, \ldots, M-1$. Then, the cyclically shifted values are processed in M processing units 18. It is possible to use less than M processing units and to reuse the existing hardware by employing multiplexing or other suitable techniques. In the encoding process, the output of the processing units 18 is stored back to the storage device 14, as illustrated by path 20. In the decoding process, the output of the processing units 18 is output from the apparatus 10 and stored in a different storage device (not shown).

D. Encoding Procedure

In the encoding procedure, the storage device 14 stores the K information bits to be encoded. Then, the T parity bits are computed in two phases.

i. Phase I

Figure 6:
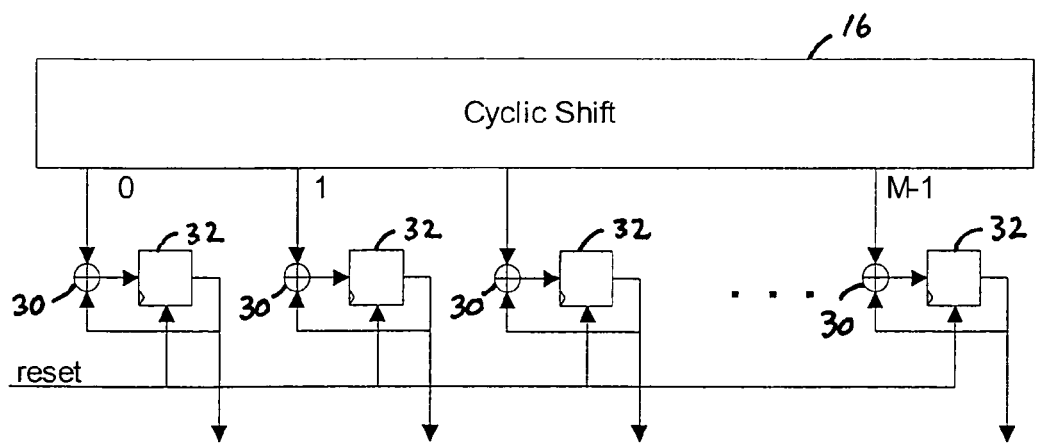
FIG. 6 is a detailed block diagram of exemplary processing units of the apparatus of FIG. 5.

Repeat q times ($u = 0, 1, 2, \ldots, q-1$) until all the parity bits are written back to the storage device 14:

1. Read row u in the inverse tables stored in the first memory 12. For each one of the $d_U$ values of r and s:
2. Read from the storage device 14 the row indexed by r.
3. Cyclically shift the read M values by s using the cyclical shift device 16.
4. In every one of the M processing units 18, compute the modulo-2 sum of $d_U$ incoming bits. The modulo-2 sum can be easily computed with a 1-bit adder (XOR gate) 30 and a flip-flop 32, as illustrated in FIG. 6. In FIG. 6, the reset signal should be asserted before processing each group of $d_U$ bits.

5. Store the M results back to the storage device 14. The write address begins in row K/M and increases by one up to the last row (N/M)−1.

ii. Phase II

1. Read the first K information bits from the storage device 14 sequentially and pass them to the next block (not shown) of the encoder. This step is optional if these bits were already output earlier from the apparatus 10. The address for the storage device 14 begins from 0 to (K/M)−1 and the M read values are passed on. If it is required to pass on the information bit by bit, then the cyclic shift device 16 can be employed for this purpose. For example, using a programmable barrel shifter, this can be accomplished by assigning a shift value starting from 0 to M−1 for every row and then taking only its first output bit from the cyclical shift device 16.

2. Read the T parity bits column by column and chain them. The final parity bit, which is output from the apparatus 10, is the modulo-2 sum of the read value and the previously computed parity bit. The cyclical shift device 16 can be employed for this purpose also. The storage device 14 is read from address K/M to (N/M)−1 and back to K/M, M times. Then for example, the data is cyclically shifted by values starting from 0 to M−1, but increasing only every q rows. The parity bit can be taken from the first output of the cyclical shift device 16.

E. Decoding Procedure

A major part of the LDPC decoding algorithm is the computation performed for the check nodes. In this computation, the received values associated with all the bits of a certain check equation are processed together in order to produce new values for the decoding process. All of these values are processed before output results can be produced by the decoder. The following procedure, described in two phases, is repeated q times (u=0, 1, 2, ..., q−1) until computations are performed for all the check equations:

i. Phase I

1. Read row u of the inverse tables in the first memory 12. For each one of the $d_U$ values of r and s:
2. Read from the storage device 14 the row indexed by r.
3. Cyclically shift the read M values $\lambda_i$ by s using the cyclical shift device 16.
4. In every one of the M processing units 18, perform the desired computation for these values.

i. Phase II

1. Read row K/M+u from the storage device 14.
2. Pass the values through the cyclic shift device 16 without any shifting (s=0).
3. In every one of the M processing units 18, perform the desired computation for these values.
4. Read row K/M+[(u−1+q)modq] from the storage device 14.
5. Pass the values through the cyclic shift device 16 without any shifting (s=0), except for the case when u=0, where shifting is performed by M−1 values and the first output value is replaced with a '0' (hard decision decoding) or with a soft value associated with a strong likelihood '0' (soft decision decoding).
6. In every one of the M processing units 18, perform the desired computation for these values.

Although FIG. 6 depicts a specific exemplary implementation of the processing units 18, one of ordinary skill in the art will appreciate that the processing units 18 can take other forms. Generally, a processing unit computes for a check node, a set of new messages to be sent to its connected bit nodes. Typically the check nodes to bit nodes messages are Log Likelihood Ratios (LLR) and the computations are performed pair-wise. The basic pair-wise operation is defined for two LLR values $\lambda_1$ and $\lambda_2$ as $$f(\lambda_1,\lambda_2)=2\tan h^{-1}(\tan h(\lambda_1/2)\cdot \tan h(\lambda_2/2)).$$

The above basic operation can be approximated with $$\tilde{f}(\lambda_1,\lambda_2)=\text{sign}(\lambda_1)\cdot\text{sign}(\lambda_2)\cdot\min(|\lambda_1|,|\lambda_2|)+\delta(|\lambda_1|-|\lambda_2|)$$

where the function $\delta(\cdot)$ is implemented with a look-up table.

A message from a check node to a bit node, computed in such a processing unit, consists of the pair-wise operations of all the connected bit nodes to check nodes messages, except for the message coming from the target bit node.

In conclusion, the apparatus and method of the present invention allows for more efficient computation of check equations in periodic LDPC codes. This is especially advantageous in situations permitting off-line computation of relatively small tables because referencing the LDPC code parity check matrix can be done row by row, as opposed to column by column as the LDPC code has been defined. This row-by-row approach is readily implemented in hardware, such as an application specific integrated circuit (ASIC) or other suitable technology, using a special memory configuration, such as the one illustrated in FIG. 4, and a cyclic shift operation.

While various embodiments of the invention have been described, it will be apparent to those of ordinary skill in the art that many more embodiments and implementations are possible that are within the scope of this invention.

What is claimed is:

1. In an encoder for a rate K/N, periodic LDPC code, where N, the number of bits in a codeword, equals the sum of K, the number of information bits, and T, the number of parity bits, the code characterized by a Table, each row of which represents M columns of a Parity Check Matrix for the code, the Parity Check Matrix defining participating bit nodes for each check node in a node representation of the code, where a row in the Table, if successively modulo-T shifted by q, where q equals T/M, generates a corresponding M columns of the Parity Check Matrix, a method of encoding K information bits, comprising the following steps:

providing at least one Inverse Table of reduced form in relation to the Parity Check Matrix and identifying, for each of q check nodes, at least one participating bit node;

for a check node p, using the at least one Inverse Table to identify at least one participating bit node for a check node v, where v=p mod q; and using the identified at least one participating bit node for the check node v to encode the K information bits, resulting in T parity bits that can be associated with the K information bits to form a codeword.

2. The method of claim 1 wherein the at least one Inverse Table identifies, for each of q check nodes, at least one participating bit node that is identified with an (r, s) pair, where r identifies a group of M bit nodes and s identifies a participating bit node within that group.

3. The method of claim 2 wherein the using step comprises the substeps of:

determining $m_i$, an identifier of at least one participating bit node for the check node p, using the formula:

$$m_i = M \cdot r_i + [(s_i+u) \bmod M],$$

where $(r_i,s_i)$ identifies a participating bit node for the check node u, and $u=\lfloor p/q \rfloor$; and using the identified at least one participating bit node for the check node p in encoding the K information bits.

4. In a decoder for a rate K/N, periodic LDPC code, where N, the number of bits in a codeword, equals the sum of K, the number of information bits, and T, the number of parity bits, the code characterized by a Table, each row of which represents M columns of a Parity Check Matrix for the code, the Parity Check Matrix defining participating bit nodes for each check node in a node representation of the code, where a row in the Table, if successively modulo-T shifted by q, where q equals T/M, generates a corresponding M columns of the Parity Check Matrix, a method of decoding a received codeword comprising the following steps:

providing at least one Inverse Table of reduced form in relation to the Parity Check Matrix and identifying, for each of q check nodes, at least one participating bit node;

for a check node p, using the at least one Inverse Table to identify at least one participating bit node for a check node v, where v=p mod q; and using the identified at least one participating bit node for the check node v to decode the received codeword.

5. The method of claim 4 wherein the at least one Inverse Table identifies, for each of q check nodes, at least one participating bit node that is identified with an (r, s) pair, where r identifies a group of M bit nodes and s identifies a participating bit node within that group.

6. The method of claim 5 wherein the using step comprises the substeps of:

determining $m_i$, an identifier of at least one participating bit node for the check node p, using the following formula:

$$m_i = M \cdot r_i + [(s_i + u) \bmod M],$$

where $(r_i, s_i)$ identifies a participating bit node for the check node u, and $u = \lfloor p/q \rfloor$; and using the identified at least one participating bit node for the check node p in decoding the received codeword.

* * * * *